(12) United States Patent
Ko et al.

(10) Patent No.: US 8,772,096 B2
(45) Date of Patent: Jul. 8, 2014

(54) METHOD OF FORMING A CONTACT AND METHOD OF MANUFACTURING A PHASE CHANGE MEMORY DEVICE USING THE SAME

(75) Inventors: Seung-Pil Ko, Hwaseong-si (KR); Eun-Jung Kim, Daegu (KR); Yong-Jun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 75 days.

(21) Appl. No.: 13/613,277

(22) Filed: Sep. 13, 2012

(65) Prior Publication Data

US 2013/0224929 A1    Aug. 29, 2013

(30) Foreign Application Priority Data

Feb. 27, 2012   (KR) .................. 10-2012-0019752

(51) Int. Cl.
*H01L 21/338*   (2006.01)
*H01L 21/8238*  (2006.01)
*H01L 21/336*   (2006.01)

(52) U.S. Cl.
USPC ........... 438/173; 438/212; 438/268; 257/263; 257/328

(58) Field of Classification Search
CPC ....... H01L 45/06; H01L 45/122; H01L 45/16; H01L 45/1691; H01L 45/00; H01L 45/1233; H01L 29/861; H01L 29/8615
USPC ................. 438/156, 173, 212, 268, 269, 639; 257/263, 328, 618, 622
See application file for complete search history.

(56) References Cited

U.S. PATENT DOCUMENTS

2012/0119181 A1*   5/2012   Oh et al. .................... 257/4

FOREIGN PATENT DOCUMENTS

| KR | 10-2010-0135094 | 12/2010 |
| KR | 10-0998489 | 12/2010 |
| KR | 10-2011-0086452 | 7/2011 |

* cited by examiner

*Primary Examiner* — Hsien Ming Lee
(74) *Attorney, Agent, or Firm* — Volentine & Whitt, PLLC

(57) ABSTRACT

Provided are a method of forming a contact and a method of manufacturing a phase change memory device using the same. The method of forming a contact includes forming on a substrate an insulating layer pattern having first sidewalls extending in a first direction and second sidewalls extending in a second direction perpendicular to the first direction and which together delimit contact holes, forming semiconductor patterns in lower parts of the contact holes, forming isolation spacers on the semiconductor pattern and side surfaces of the first sidewalls to expose portions of the semiconductor patterns, and etching the exposed portions of the semiconductor patterns using the isolation spacers as a mask to divide the semiconductor patterns into a plurality of finer semiconductor patterns.

20 Claims, 29 Drawing Sheets

FIG.1

| 10_1 | 10_2 | 10_3 | 10_4 | 10_5 | 10_6 | 10_7 | 10_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) | | SA/WD(20_2) | | SA/WD(20_3) | | SA/WD(20_4) | |
| PERIPHERY(30) | | | | | | | |
| SA/WD(20_8) | | SA/WD(20_7) | | SA/WD(20_6) | | SA/WD(20_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

METHOD OF FORMING A CONTACT AND METHOD OF MANUFACTURING A PHASE CHANGE MEMORY DEVICE USING THE SAME

PRIORITY STATEMENT

This application claims priority from Korean Patent Application No. 10-2012-0019752 filed on Feb. 27, 2012 in the Korean Intellectual Property Office, and all the benefits accruing therefrom under 35 U.S.C. 119, the contents of which are hereby incorporated by reference in their entirety.

BACKGROUND

1. Technical Field

The present inventive concept relates to a method of forming a contact and to a method of manufacturing a phase change memory device using the same.

2. Description of the Related Art

Non-volatile memory devices using a resistance material include phase change random access memories (PRAMs), resistive RAMs (RRAMs), magnetic RAMs (MRAMs) and the like. A dynamic RAM (DRAM) or flash memory device stores data using charges, whereas a non-volatile memory device using a resistance material stores data using a change of the state of a phase change material such as chalcogenide alloy (in the case of a PRAM), a change in resistance of a variable resistance material (in the case of an RRAM), a change in resistance of a magnetic tunnel junction (MTJ) thin film according to the magnetized state of a ferromagnetic material (in the case of an MRAM) or the like.

For example, in a phase change memory device, the state of the phase change material changes, from one of a crystalline state and an amorphous state to the other, as the phase change material cools after being heated. The phase change material in the crystalline state has a low resistance and the phase change material in the amorphous state has a high resistance. Accordingly, the crystalline state may define set data or "0" data, and the amorphous state may be define reset data or "1" data.

Phase change memory devices, like most semiconductor devices, are made up layers of patterns of circuit elements, which will be simply referred to hereafter as circuit patterns. A circuit pattern is conventionally formed using photolithography. In general, photolithography includes an exposure process in which a layer of photoresist on a target layer is exposed to an image corresponding to the desired circuit pattern, and a developing process in which the exposed or non-exposed portions of the layer of photoresist are removed, resulting in the formation of a photoresist pattern. Then the target layer is etched using the photoresist pattern as a mask.

Recently, the size and spacing of features constituting a circuit pattern are being gradually decreased to attain higher degrees of integration in phase change memory devices. In this respect, the resolution of the photolithography process imposes limits on the degree to which circuit patterns can be scaled down. Therefore, different techniques are being studied and developed in an attempt to increase the resolution of photolithography. For example, light sources that generate light of shorter wavelengths for use in the exposure process have been developed.

SUMMARY

According to one aspect of the inventive concept there is provided a method of forming a contact in which an insulating layer pattern having a plurality of contact holes is formed on a substrate, initial semiconductor patterns are formed in the contact holes, respectively, isolation spacers that expose portions of the initial semiconductor patterns are formed, and the exposed portions of the initial semiconductor patterns are etched using the isolation spacers to divide each the initial semiconductor patterns into a plurality of semiconductor patterns. The insulating layer pattern has first and second sidewalls delimiting the contact holes. The first sidewalls extend in a first direction and the second sidewalls extend in a second direction perpendicular to the first direction. The isolation spacers that expose portions of each of the initial semiconductor patterns are formed on the initial semiconductor patterns and side surfaces of the first sidewalls.

According to another aspect of the inventive concept there is provided a method of manufacturing a phase change memory device, in which an insulating layer pattern is formed on a substrate, the insulating layer pattern having first sidewalls extending in a first direction and second sidewalls extending in a second direction perpendicular to the first direction and the first and second sidewalls delimiting first contact holes that expose portions of the substrate, vertical cell diodes are then formed in lower portions of the first contact holes, respectively, such that upper portions of the second sidewalls project above upper surfaces of the vertical cell diodes, the upper portions of the second sidewalls which project above the upper surfaces of the vertical cell diodes are then removed, isolation spacers that expose central portions of the upper surfaces of the vertical cell diodes are formed on the upper surfaces of the vertical cell diodes and side surfaces of the first sidewalls, and the vertical cell diodes are etched using the isolation spacers to divide each of the vertical cell diodes into two vertical cell diodes.

According to still another aspect of the inventive concept there is provided a method of manufacturing a semiconductor device, in which an insulating layer is formed on a substrate, quadrangular contact holes are formed through the insulating layer using photolithographic and etching processes to thereby pattern the insulating layer, initial patterns of semiconductor material are formed in lower portions of the contact holes, respectively, and surfaces that delimit upper portions of the contact holes are left exposed, an isolation layer is formed on the patterned insulating layer and initial patterns of semiconductor material, and the isolation layer is used to divide each the initial semiconductor patterns into a plurality of finer semiconductor patterns.

BRIEF DESCRIPTION OF THE DRAWINGS

The above and other aspects and features of the inventive concept will become more apparent from the following detailed description of the preferred embodiments thereof made with reference to the attached drawings, in which:

FIG. 1 is a block diagram of a non-volatile memory device in accordance with the inventive concept;

FIGS. 3 to 24 illustrate a method of manufacturing a phase change memory device in accordance with the inventive concept, wherein FIG. 3 is a plan view of an intermediate product at an initial stage of the method, FIG. 4 is a cross-sectional view taken along lines I-I' and II-II' of FIG. 3, FIGS. 5-7 are each a perspective view of an intermediate product, FIGS. 8 and 9 are each a cross-sectional view of an intermediate product taken in the direction of line III-III' of FIG. 7, FIGS. 10-13 are each a perspective view of an intermediate product, FIG. 14 is a cross-sectional view taken along line IV-IV' of FIG. 13, FIG. 15 is a perspective view of an intermediate product, FIGS. 16-23 are each a cross-sectional view of an intermediate product, and FIG. 24 is a plan view of the device at a final stage of the method;

DETAILED DESCRIPTION OF THE PREFERRED EMBODIMENTS

Figure 2:
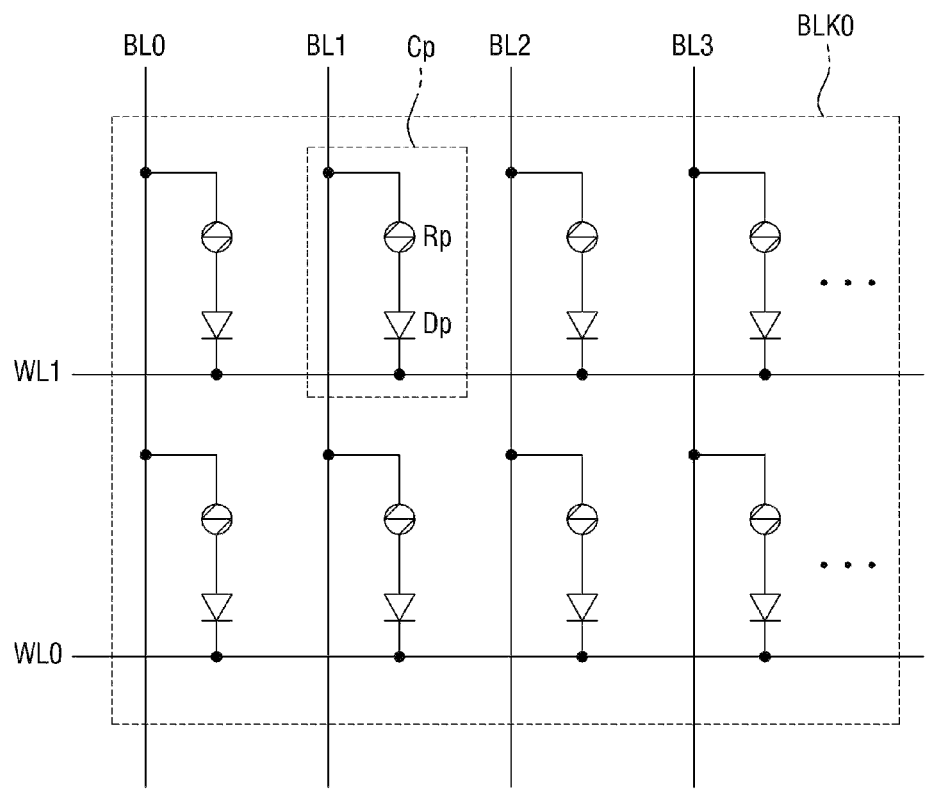
FIG. 2 is a circuit diagram of a non-volatile memory device in accordance with the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" another element or layer, it can be directly on the other element or layer or intervening elements or layers may be present. In contrast, when an element or layer is referred to as being "directly on" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "pattern" may be used to refer to one feature that is fabricated as a result of a patterning process or may be used to refer to a layer that has been patterned or series of features produced as the result of the patterning of the layer. The term "extending" will generally reference a longitudinal direction or lengthwise dimension of a particular feature or element.

Hereinafter, a method of forming a contact in accordance with the inventive concept will be described in connection with a phase change random access memory (PRAM). However, it will be clear that the method may be applied to various other types of semiconductor devices including non-volatile memory devices using a resistance material, such as a resistive RAM (RRAM) and a ferroelectric RAM (FRAM).

First, though, the architecture in general of a non-volatile memory device in accordance with the inventive concept will be described with reference to the block diagram of FIG. 1 and the circuit diagram of FIG. 2.

The non-volatile memory device has a plurality of memory banks 10_1 to 10_16, a plurality of sense amplifiers and write drivers SA/WD (20_1 to 20_8), and a peripheral circuit region 30. Although sixteen memory banks are listed, the inventive concept is not limited to a device having only sixteen memory banks.

Each of the memory banks 10_1 to 10_16 includes a plurality of memory blocks BLK0 to BLK7. Each of the memory blocks BLK0 to BLK7, in turn, includes a plurality of non-volatile memory cells arranged in a matrix. In this example, eight memory blocks are provided in each memory bank but, again, the inventive concept is not so limited.

Furthermore, although not shown in detail in the drawings, row decoders and column decoders may be arranged to correspond to the memory banks 10_1 to 10_16 to designate rows and columns of the non-volatile memory cells to be read or written, respectively.

In this example, each of the sense amplifiers and write drivers SA/WD (20_1 to 20_8) is operatively associated with two respective memory banks 10_1 to 10_16 to perform a read and write operation in the two memory banks. However, the inventive concept is not so limited. Rather, each of the sense amplifiers and write drivers SA/WD (20_1 to 20_8) is operatively associated with at least one of the memory banks, respectively. Thus, each of the sense amplifiers and write drivers SA/WD (20_1 to 20_8) may be operatively associated with one or four of the memory banks.

In the peripheral circuit region 30, a plurality of logic circuit blocks and voltage generation units are disposed to operate the row decoders and the column decoders, the sense amplifiers and write drivers and the like.

A region of the device containing only the first memory block BLK0 will now be described with reference to FIG. 2 for the sake of simplicity. In this respect, the regions of the device containing the other memory blocks have similar structures.

In the region of first memory block BLK0, the non-volatile memory device in accordance with the inventive concept has a plurality of non-volatile memory cells Cp, a plurality of bit lines BL0 to BL3, and a plurality of word lines WL0 and WL1.

The non-volatile memory cells Cp are located at regions where the word lines WL0 and WL1 intersect the bit lines BL0 to BL3. The state of the non-volatile memory cells Cp is changed into a crystalline state or amorphous state according to through current. Each of the non-volatile memory cells Cp includes a phase change element Rp having a different resistance in each state, and a vertical cell diode Dp controlling the through current flowing in the phase change element Rp. In this case, the phase change element Rp may be formed of a combination of two elements such as GaSb, InSb, InSe, $Sb_2Te_3$ and GeTe, a combination of three elements such as GeSbTe, GaSeTe, InSbTe, $SnSb_2Te_4$ and InSbGe, or a combination of four elements such as AgInSbTe, (GeSn)SbTe, GeSb(SeTe) and $Te_{81}Ge_{15}Sb_2S_2$, for example. In an example of this embodiment, the phase change element Rp is of GeSbTe, i.e., consists of germanium (Ge), antimony (Sb) and tellurium (Te). In the example of FIG. 2, the phase change element Rp is coupled to the bit lines BL0 to BL3 and the vertical cell diode Dp is coupled to the word lines WL0 and WL1. Alternatively, the phase change element Rp may be coupled to the word lines WL0 and WL1 and the vertical cell diode Dp may be coupled to the bit lines BL0 to BL3.

Hereinafter, an operation of the non-volatile memory device will be described with reference to FIG. 2.

First, in a write operation of the non-volatile memory device, the state of the phase change element Rp is changed to an amorphous state of logic level 1 by heating the phase change element Rp beyond a melting temperature Tm and cooling it rapidly, or a crystalline state of logic level 0 by heating the phase change element Rp to a temperature between a crystallization temperature Tx and the melting temperature Tm and cooling it after maintaining the heated temperature for a predetermined period of time. Here, in order to change the state of the phase change element Rp, write current of significantly high level is passed through the phase change element Rp. For example, a write current of about 1 mA is provided for reset, and a write current of about 0.6 to 0.7 mA is provided for set. The write current is provided from a write circuit (not shown) and flows to a ground voltage through the bit lines BL0 to BL3 and the vertical cell diode Dp.

Meanwhile, in a read operation of the non-volatile memory device, read current is supplied to the phase change element Rp at a level not causing a phase change of the phase change element Rp. The read current is provided from a read circuit (not shown) and flows to ground through the bit lines BL0 to BL3 and the vertical cell diode Dp.

A method of manufacturing a phase change memory device in accordance with the inventive concept will now be described with reference to FIGS. 3 to 24.

Figure 3:
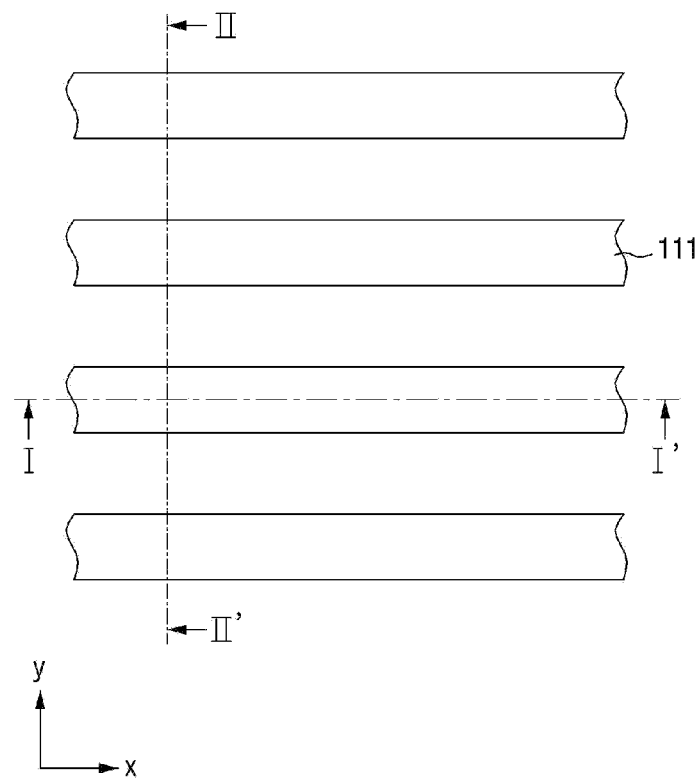
Figure 4:
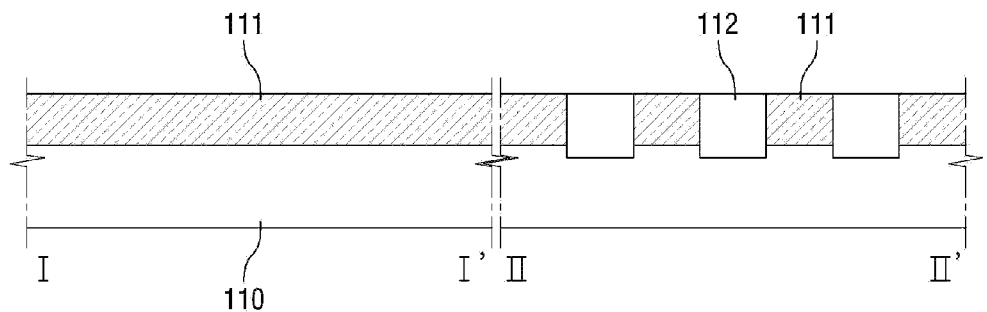

First, referring to FIGS. 3 and 4, element isolation regions 112 are formed in a substrate 110 of a first conductivity type (e.g., P type) to define a plurality of active regions 111. For example, the active regions 111 may extend parallel to each other in a second direction (e.g., an X direction). Word lines WL0, WL1, WL2 and WL3 may be formed by implanting impurities of a second conductivity type (e.g., N type) in the active regions 111. The substrate 110 may be a silicon substrate, silicon on insulator (SOI) substrate, gallium arsenide substrate, silicon germanium substrate or the like. The element isolation regions 112 may be shallow trench isolation (STI) or field oxide (FOX) regions formed by using a local oxidation of silicon (LOCOS) method.

Alternatively, the word lines WL0, WL1, WL2 and WL3 may be formed by an epitaxial growth process. Specifically, for example, a mold layer pattern having a plurality of openings is formed on the substrate 110 to expose specific regions of the substrate 110. Subsequently, an epitaxial layer is formed in the openings by selective epitaxial growth (SEG), solid phase epitaxial growth (SPE) or the like. By ion implanting impurities of the second conductivity type into the entire surface of the substrate 110 on which the epitaxial layer has been grown, the word lines WL0, WL1, WL2 and WL3 are completed. However, ion implantation may be omitted in the case in which impurities are doped in-situ in the selective epitaxial growth or solid phase epitaxial growth process.

Referring to FIGS. 5 to 12, an insulating layer pattern 160 including a plurality of contact holes 163 is formed on the substrate 110. The insulating layer pattern 160 has first sidewalls 161 and second sidewalls 162 that intersect each other, and which delimit the contact holes. For example, the first sidewalls 161 may extend in the first direction (e.g., a Y direction) and the second sidewalls 162 may extend in a second direction (X direction) perpendicular to the first direction. An example of the way in which the insulating layer pattern 160 can be formed will now be described in more detail.

Figure 5:
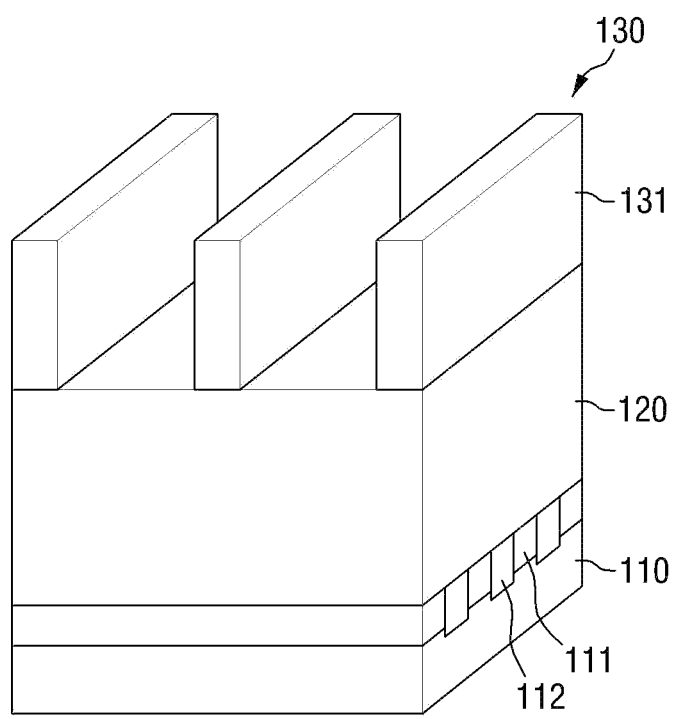

Referring to FIG. 5, an insulating layer 120 is formed on the substrate 110, and a first sacrificial layer pattern 130 is formed on the insulating layer 120. The first sacrificial layer pattern 130 may include a plurality of first lines 131 extending in the first direction to expose portions of the insulating layer 120.

Specifically, the insulating layer 120 may be formed as a silicon oxide ($SiO_2$) layer on the substrate 110, in which the active regions 111 have been formed, by chemical vapor deposition (CVD), physical vapor deposition (PVD), atomic layer deposition (ALD) or the like. The first sacrificial layer pattern 130 may be formed by forming a first sacrificial layer (not shown) on the insulating layer 120 by CVD, PVD, ALD or the like, forming a hard mask pattern defining a region where the first sacrificial layer pattern will be formed on the first sacrificial layer by CVD, PVD, ALD or the like, and etching the first sacrificial layer using the hard mask pattern as an etching mask. In this case, the first sacrificial layer may be formed of polysilicon. The hard mask pattern may be formed of a single material or a combination materials selected from the group consisting of silicon oxide ($SiO_2$), silicon nitride (SiN), silicon oxynitride (SiON) and carbon based materials. For example, the hard mask pattern may be formed as a spin-on hardmask (SOH) containing a carbon based material.

Figure 6:
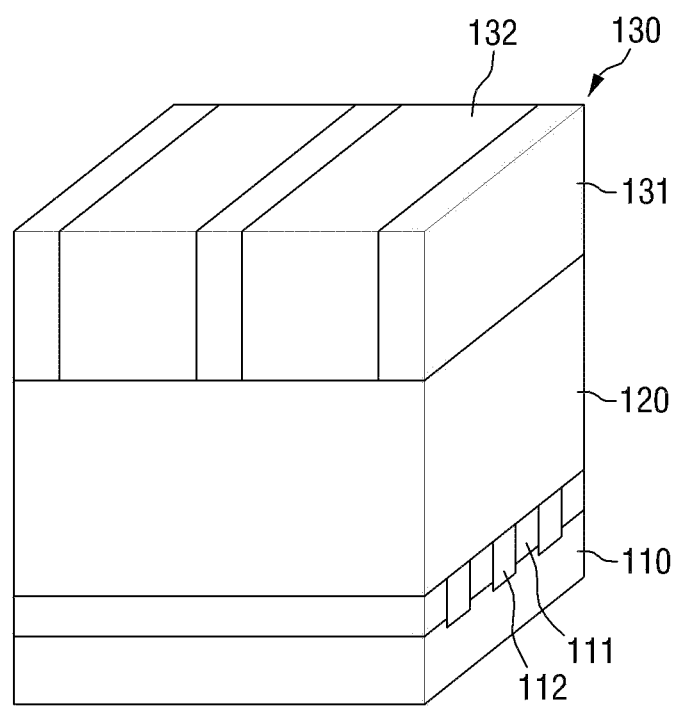

Referring to FIG. 6, an inter-pattern insulating layer 132 is formed between the first lines 131 in the first direction. The inter-pattern insulating layer 132 covers the insulating layer 120 for insulating layer pattern which has been exposed in FIG. 5.

Specifically, an insulating layer (not shown) is deposited on the first sacrificial layer pattern 130 and the insulating layer 120 by CVD, PVD, ALD or the like, and planarized by using an etch-back method, chemical mechanical polishing (CMP) method or the like until the first sacrificial layer pattern 130 (i.e., upper surfaces of the first lines 131) is exposed, thereby forming the inter-pattern insulating layer 132.

Referring to FIGS. 7 to 10, a second sacrificial layer pattern 140 is formed on the first sacrificial layer pattern 130 and the inter-pattern insulating layer 132. The second sacrificial layer pattern 140 includes a plurality of second lines 142 extending in the second direction to expose portions of the first sacrificial layer pattern 130 and the inter-pattern insulating layer 132. An example of the way in which the second sacrificial layer pattern 140 can be formed will now be described in detail.

Figure 7:
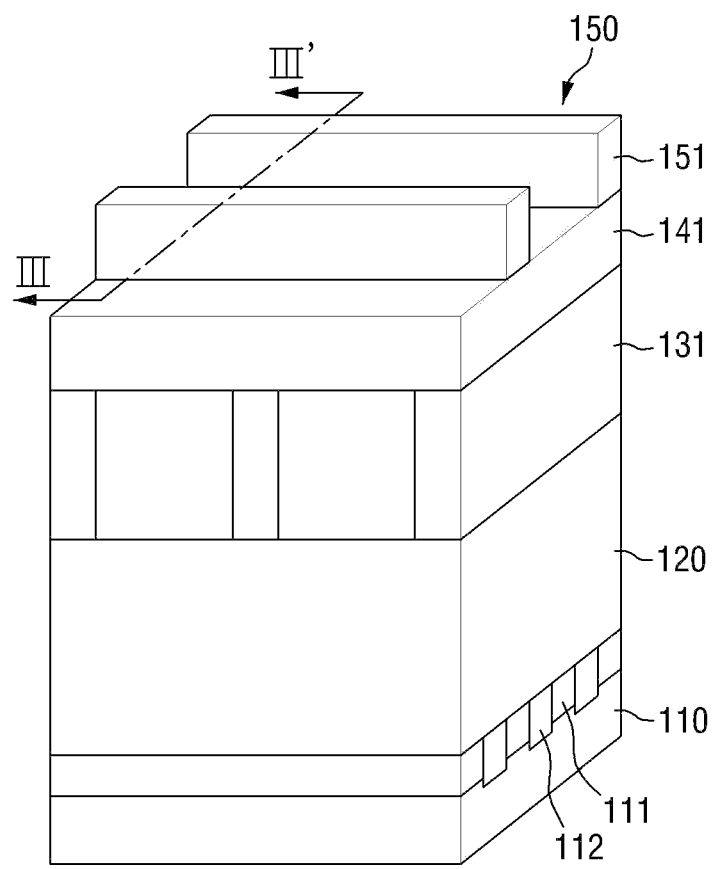

First, referring to FIG. 7, a second sacrificial layer 141 is formed on the first sacrificial layer pattern 130 and the inter-pattern insulating layer 132 by CVD, PVD, ALD or the like. A third sacrificial layer pattern 150 including a plurality of third lines 151 extending in the second direction is formed on the second sacrificial layer 141. The third sacrificial layer pattern 150 may be formed by forming a third sacrificial layer (not shown) on the second sacrificial layer 141, forming a mask pattern defining a region where the third sacrificial layer pattern will be formed on the third sacrificial layer, and etching the third sacrificial layer using the mask pattern as an etch mask. The second sacrificial layer 141 may be formed of polysilicon. The third sacrificial layer pattern 150 may be formed by depositing silicon oxide ($SiO_2$) by ALD.

Figure 8:
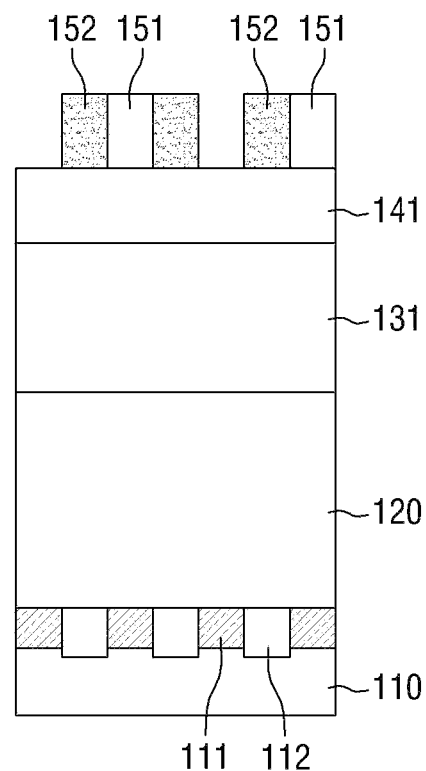

Referring to FIG. 8, sacrificial layer spacers 152 are formed at both sides of each of the third lines 151 to expose portions of the second sacrificial layer 141. Then, the third sacrificial layer pattern 150 is removed.

Specifically, an insulating layer (not shown) is deposited on the second sacrificial layer 141 and upper and side surfaces of the third lines 151 by CVD, PVD, ALD or the like. The insulating layer is anisotropically etched until the upper surfaces of the third lines 151 and the upper surface of the second sacrificial layer 141 are exposed. Thus, the sacrificial layer spacers 152 are formed at both sides of each of the third lines 151 to expose portions of the upper surface of the second sacrificial layer 141. Then, the third lines 151, which are interposed between the sacrificial layer spacers 152 while their upper portions are exposed, are removed by etching, e.g., dry etching. The sacrificial layer spacers 152 may be formed of silicon oxide ($SiO_2$), silicon nitride (SiN), silicon oxynitride (SiON) or the like. By this double patterning method, a distance between patterns can be smaller and a fine pattern can be easily formed.

Figure 9:
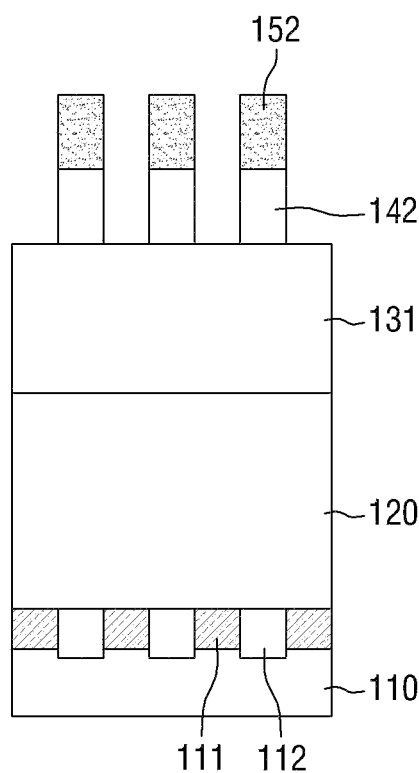
Figure 10:
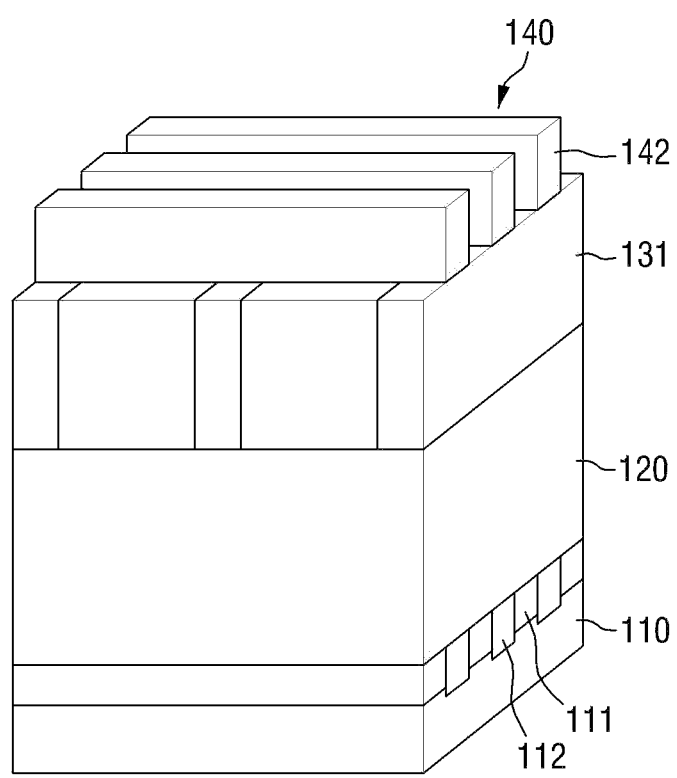

Subsequently, referring to FIGS. 9 and 10, the second sacrificial layer 141 is etched using the sacrificial layer spacers 152 as a mask to form the second sacrificial layer pattern 140 including the second lines 142 extending in the second direction.

Figure 11:
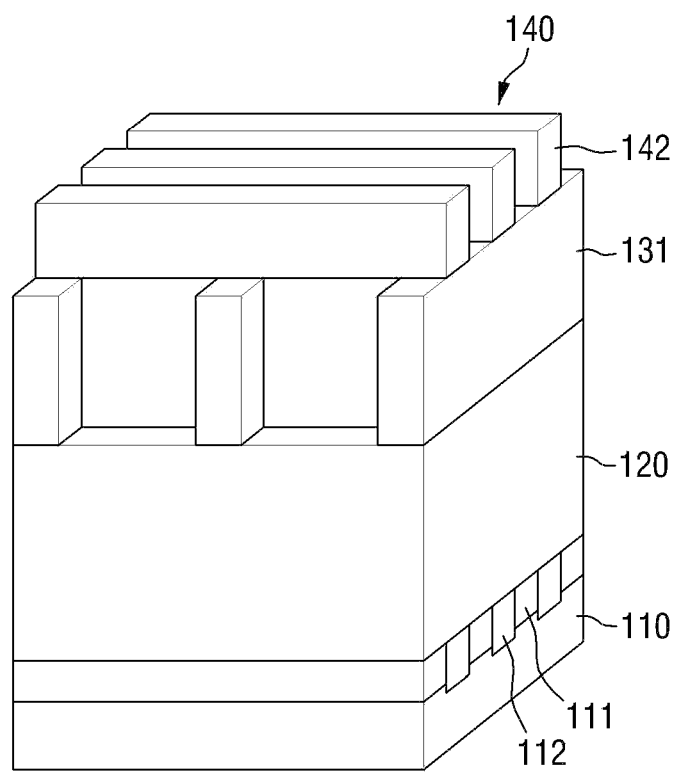

Referring to FIG. 11, the inter-pattern insulating layer 132 is etched using the second sacrificial layer pattern 140 as a mask.

Specifically, the inter-pattern insulating layer 132 is etched using, as a mask, the second sacrificial layer pattern 140 formed on the first sacrificial layer pattern 130 and the inter-pattern insulating layer 132 to expose portions of the insulating layer 120. For example, in a case in which the first sacrificial layer pattern 130 and the second sacrificial layer pattern 140 are formed of polysilicon and the inter-pattern insulating layer 132 is formed of silicon oxide ($SiO_2$), the first sacrificial layer pattern 130 and the second sacrificial layer pattern 140 are not etched while the inter-pattern insulating layer 132 is etched because polysilicon has a high degree of etch selectivity with respect to silicon oxide ($SiO_2$). Accordingly, portions of the insulating layer 120 located below the inter-pattern insulating layer 132 are exposed.

Figure 12:
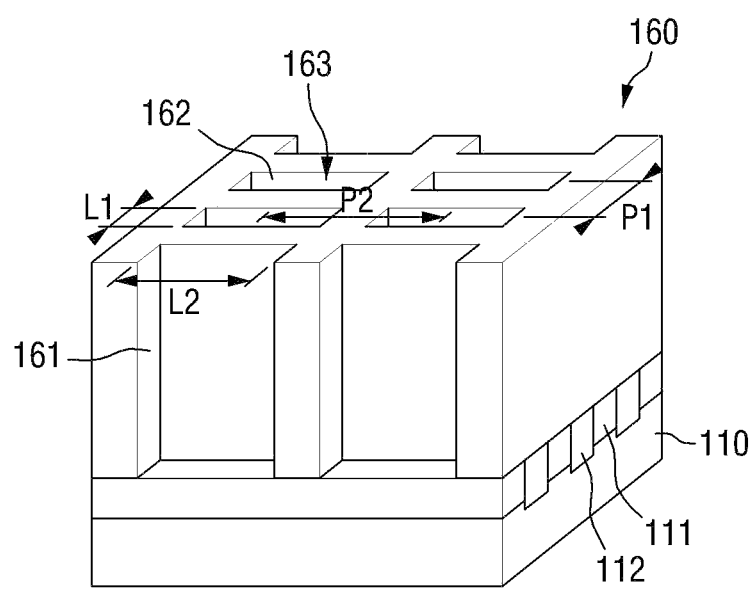

Referring to FIG. 12, the insulating layer 120 is etched using the first sacrificial layer pattern 130 and the second sacrificial layer pattern 140 as a mask, thereby forming the insulating layer pattern 160. In this case, the insulating layer pattern 160 includes a plurality of the contact holes 163 that expose portions of the substrate 110.

Specifically, portions of the insulating layer 120 exposed by the etching of the inter-pattern insulating layer 132 are themselves in turn etched (dry etching or wet etching) using the first sacrificial layer pattern 130 and the second sacrificial layer pattern 140 as a mask, thereby forming the first sidewalls 161 extending parallel to one another in the first direction and the second sidewalls 162 extending parallel to one another in the second direction. In this example, each of the contact holes 163 is delimited by a pair of the first sidewalls 161 and a pair of the second sidewalls 162. Furthermore, the contact holes 163 have a pitch P2 in the second direction which is greater than their pitch P1 in the first direction. For example, the pitch P2 in the second direction may be at least twice the pitch P1 in the first direction. Furthermore, the contact holes 163 have a width L1 in the first direction, which is smaller than their width L2 in the second direction. Here, 'pitch' means the distance between the centers of two adjacent contact holes 163, and 'width' means the largest horizontal dimension of the contact holes in the respective first direction or second direction.

Figure 13:
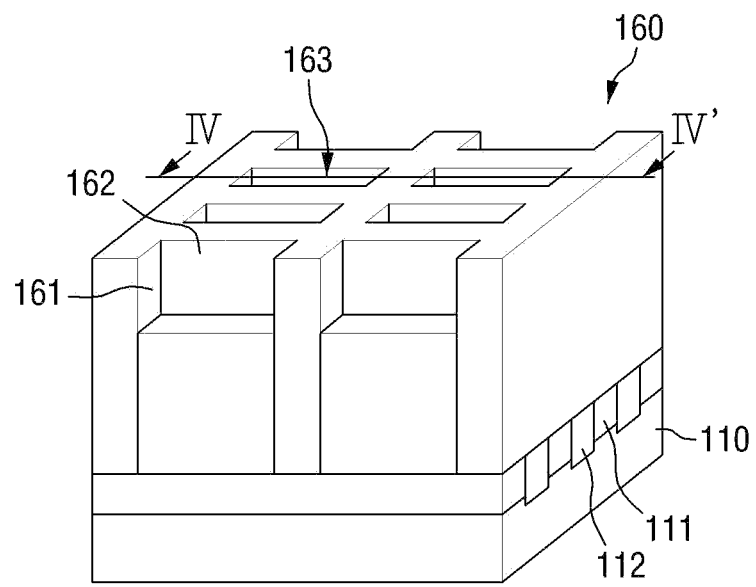
Figure 14:
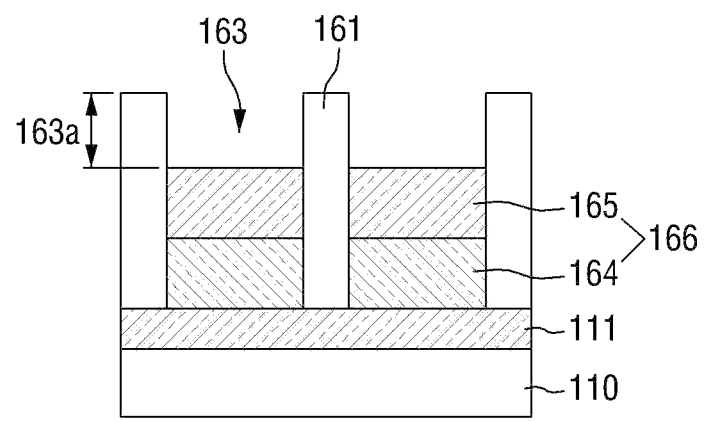

Referring to FIGS. 13 and 14, semiconductor patterns 166 are formed in the contact holes 163, respectively. Specifically, a first semiconductor layer 164 and a second semiconductor layer 165 may be formed in the contact holes 163, thereby forming the vertical cell diodes Dp.

The first and second semiconductor layers 164 and 165 may be formed by various methods. For example, the first and second semiconductor layers 164 and 165 may be grown by a selective epitaxial growth process. In this case, the first semiconductor layer 164 may be grown by using the active regions 111 or word lines WL0, WL1, WL2 and WL3 exposed by openings 163 as a seed layer, and the second semiconductor layer 165 may be grown by using the first semiconductor pattern 164 as a seed layer. In this case, if the active regions 111 or the word lines WL0, WL1, WL2 and WL3 are mono-crystalline, the first and second semiconductor layers 164 and 165 will also be mono-crystalline. Alternatively, the first and second semiconductor layers 164 and 165 may be formed by a solid phase epitaxial growth (SPE) process. Subsequently, impurities of the second conductivity type (e.g., N type) are ion implanted into the first semiconductor layer 164, and impurities of the first conductivity type (e.g., P type) are ion implanted into the second semiconductor layer 165. However, ion implantation may be omitted in a case in which impurities are doped in-situ in the selective epitaxial growth or solid phase epitaxial growth process.

Moreover, the first semiconductor layer 164 may have an impurity concentration lower than that of the word lines WL0, WL1, WL2 and WL3, and the second semiconductor layer 165 may have an impurity concentration higher than that of the first semiconductor layer 164. Accordingly, if a reverse bias is applied to the cell diode Dp, it is possible to reduce leakage current flowing through the reverse biased vertical cell diode. The reverse bias may be applied to the vertical cell diode Dp of the phase change memory cell which is not selected in the write or read operation.

In the illustrated example of this embodiment, the semiconductor patterns 166 do not fill the contact holes 163, such that upper regions 163a of sidewalls that define the contact holes 163 do not contact the semiconductor patterns 166. This feature may be provided directly by controlling the selective epitaxial growth or solid phase epitaxial growth process, or by filling the contact holes 163 with semiconductor material and then etching the material to remove it from the upper regions 163a of the contact holes 163.

Figure 15:
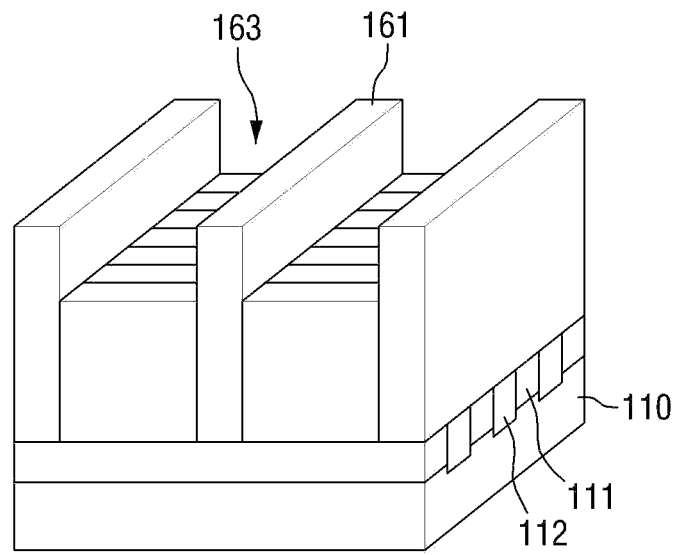

Referring to FIG. 15, the portions of the second sidewalls 162 which project above the upper surface of the semiconductor patterns 166 (i.e., upper portions of the second sidewalls 162) are removed. For example, the upper portions of the second sidewalls 162 are removed using a photolithographic process in which the upper portions of the second sidewalls 162 are the target layer. This process facilitates the forming of isolation spacers in the subsequent process.

Figure 16:
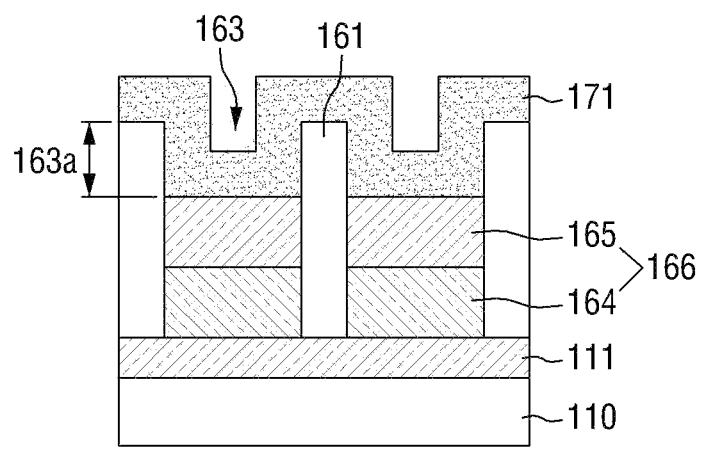
Figure 17:
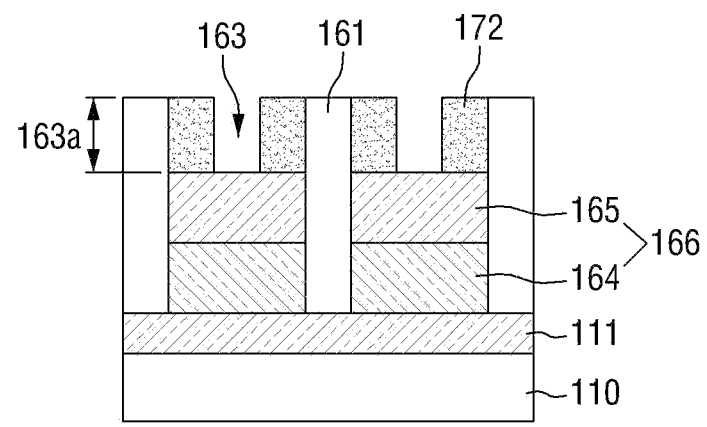

FIGS. 16 and 17 show the forming of the isolation spacers 172 on side surfaces of the first sidewalls 161.

Specifically, referring to FIG. 16, an insulating layer 171 is formed on the entire surface of the resultant structure of FIG. 15, i.e., the upper surfaces of the semiconductor patterns 166 and the upper and side surfaces of the first sidewalls 161, by CVD, PVD, ALD or the like. Subsequently, and referring to FIG. 17, the insulating layer 171 is etched back or anisotropically etched until the upper surfaces of the first sidewalls 161 and portions of the upper surfaces of the semiconductor patterns 166 are exposed, thereby forming the isolation spacers 172 on the side surfaces of the first sidewalls 161.

Figure 18:
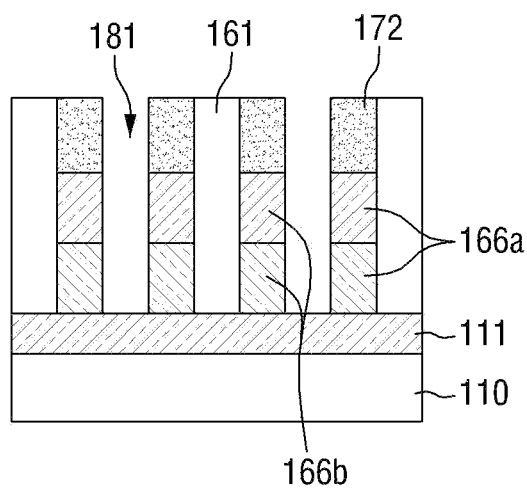

Referring to FIG. 18, each semiconductor pattern 166 in a contact hole 163 is divided into a plurality of semiconductor patterns 166a and 166b by using the isolation spacers 172. In the illustrated example, each semiconductor pattern 166 is divided into two semiconductor patterns 166a and 166b, but the inventive concept is not so limited.

In any case, the exposed semiconductor patterns 166 are etched using the isolation spacers 172 as an etching mask. As a result, a central portion of each semiconductor pattern 166 is removed, thereby forming an opening 181. The opening 181 exposes a portion of the substrate 110 and divides the semiconductor pattern 166 into two semiconductor patterns 166a and 166b.

In one example of this method in accordance with the inventive concept, the initial semiconductor patterns 166 in the contact holes 163 have the form of vertical cell diodes and so, a plurality of vertical cell diodes are formed as the direct result of dividing the semiconductor patterns 166. However, in another example of this method, impurities may be implanted into the structures in the contact holes 163 after the patterns have been divided, to form a plurality of the diodes in each contact hole 163.

In any case, in the method of manufacturing a phase change memory device in accordance with the inventive concept as described so far above, a relatively large contact hole is formed initially. Accordingly, a semiconductor pattern can be easily formed initially in the contact hole which ensures that the physical properties of the semiconductor pattern are of high quality. Then, the initial semiconductor pattern in the contact hole is divided into finer patterns.

Therefore, it is possible to secure a large processing margin and thereby ensure the uniformity of contacts and prevent misalignments which can lead to the formation of contact bridges from occurring.

Figure 19:
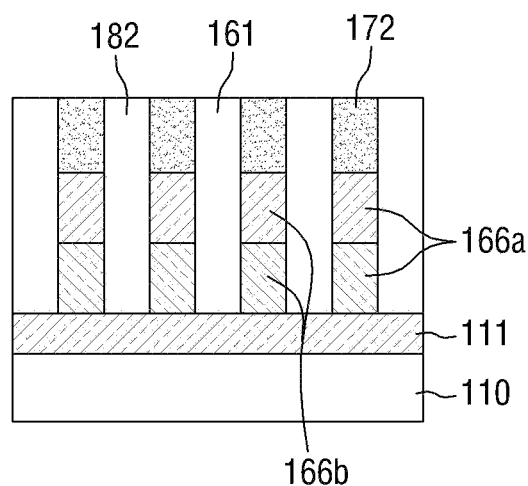
Figure 20:
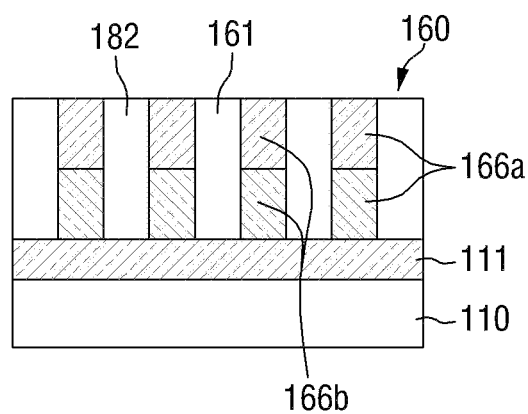

Next, and referring to FIGS. 19 and 20, an isolation layer 182 is formed by filling the openings 181 between the semiconductor patterns 166a and 166b, and the isolation spacers 172 are removed.

Specifically, an insulating layer (not shown) is formed in the openings 181, and on the isolation spacers 172 and the first sidewalls 161 by CVD, PVD, ALD or the like, and is planarized by etch-back or chemical mechanical polishing until the upper surfaces of the semiconductor patterns 166a and 166b are exposed, thereby forming the isolation layer 182. At this time, the isolation spacers 172 may be removed to expose the upper surfaces of the semiconductor patterns 166a and 166b.

Figure 21:
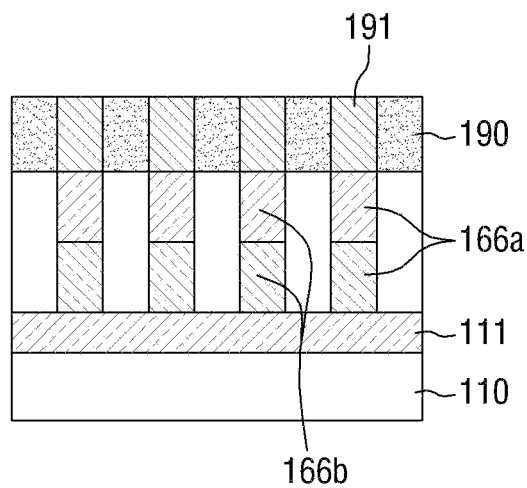

Referring to FIG. 21, a lower insulating layer 190 containing bottom electrode contacts (BEC) 191 is formed on the insulating layer pattern 160.

Specifically, a lower insulating layer is formed on the insulating layer pattern 160, a mask pattern defining a region where the bottom electrode contacts will be located is formed on the lower insulating layer, and the lower insulating layer is etched using the mask pattern as an etch mask. Thus, second contact holes are formed in the lower insulating layer to expose the semiconductor patterns 166a and 166b (e.g., vertical cell diodes). Subsequently, a conductive layer (not shown) is formed on the upper surface of the lower insulating layer and in the second contact holes, and planarized to expose the upper surface of the lower insulating layer thereby forming the lower insulating layer 190 in which the bottom electrode contacts 191 are buried.

The bottom electrode contacts 191 may be formed of a single material or a combination of materials selected from the group consisting of titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and tantalum oxynitride (TaON.

Figure 22:
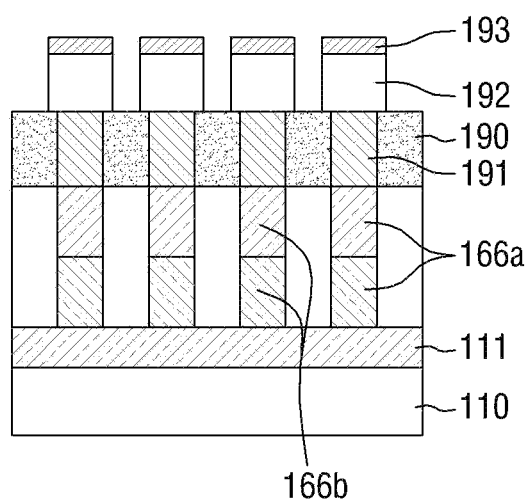

Referring to FIG. 22, a phase change material pattern 192 and top electrode contacts (TEC) 193 are formed on the bottom electrode contact 191.

Specifically, a phase change material layer and a conductive layer may be sequentially formed on the substrate 110, and patterned to form the phase change material pattern 192 and the top electrode contacts 193. Here, the phase change material layer may be formed by a physical vapor deposition technique such as a sputtering process. Even though sputtering characteristically produces poor step coverage, the phase change material layer may have a uniform thickness across the entire substrate 110 because the bottom electrode contacts 191 present a flat face on which to form the phase change material layer.

The phase change material pattern 192 may be formed of various types of materials, e.g., a material consisting of a combination of two elements such as GaSb, InSb, InSe, $Sb_2Te_3$ or GeTe, a material consisting of a combination of three elements such as GeSbTe, GaSeTe, InSbTe, $SnSb_2Te_4$ or InSbGe, or a material consisting of a combination of four elements such as AgInSbTe, (GeSn)SbTe, GeSb(SeTe) and $Te_{81}Ge_{15}Sb_2S_2$. The top electrode contacts 193 may be formed of titanium/titanium nitride (Ti/TiN).

Figure 23:
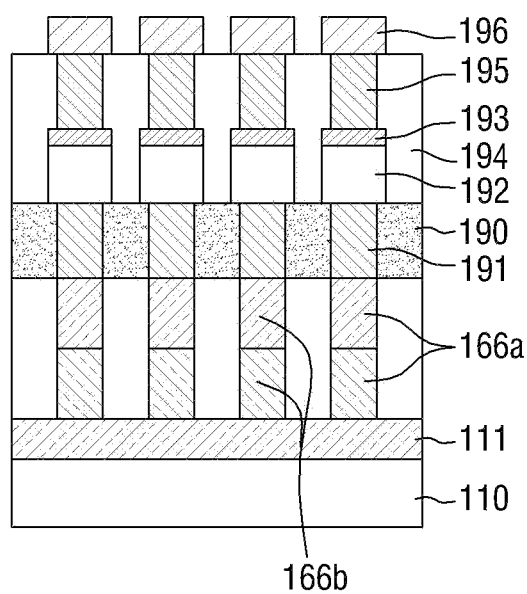
Figure 24:
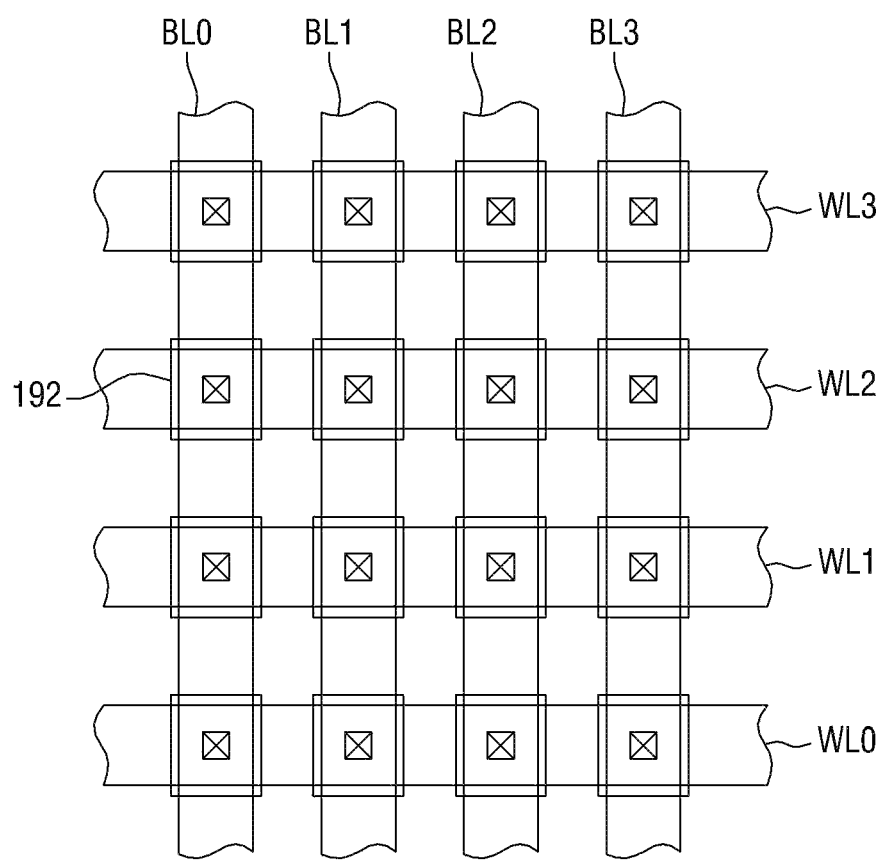

Referring to FIGS. 23 and 24, an upper insulating layer 194 including contact holes is then formed on the substrate 110 to cover the top electrode contacts 193. Bit line contact plugs 195 are formed in the contact holes. Then, bit lines 196 (bit lines BL0 to BL3) are formed on the bit line contact plugs 195 to extend in the first direction. The bit lines BL0 to BL3 may thus cross over the word lines WL0 to WL3.

Hereinafter, another embodiment of a method of manufacturing a phase change memory device in accordance with the inventive concept will be described with reference to FIGS. 25 to 31.

Figure 25:
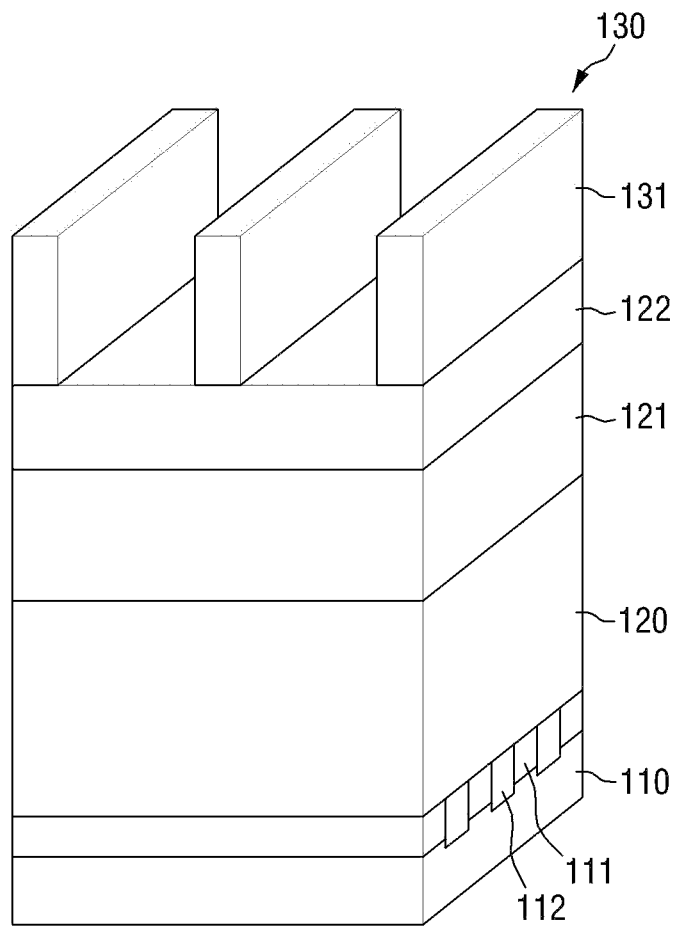
FIGS. 25 to 31 are perspective views of intermediate structures during stages of another embodiment of a method of manufacturing a phase change memory device in accordance with the inventive concept.
Figure 26:
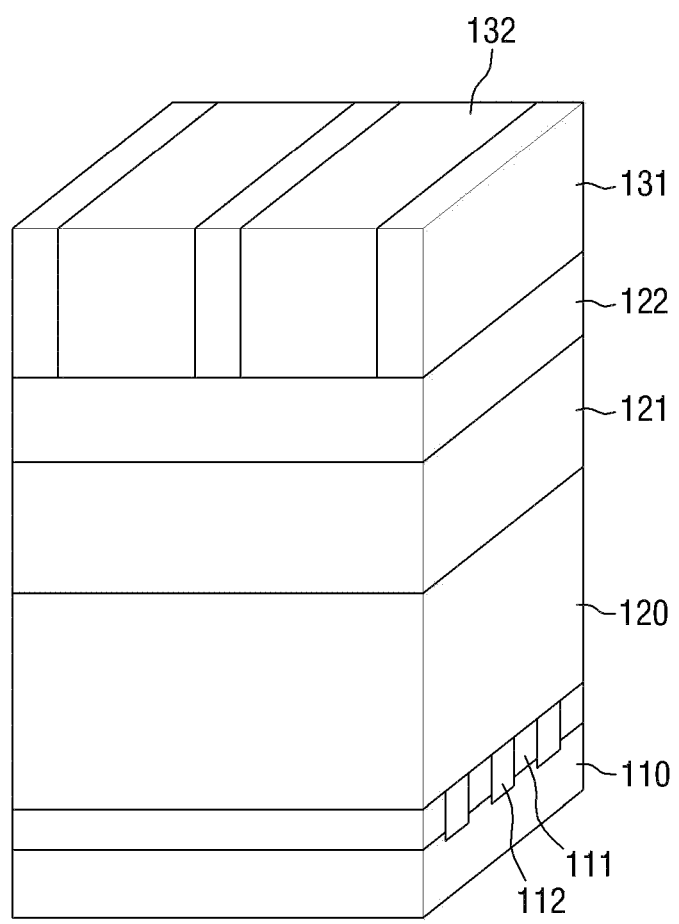
Figure 27:
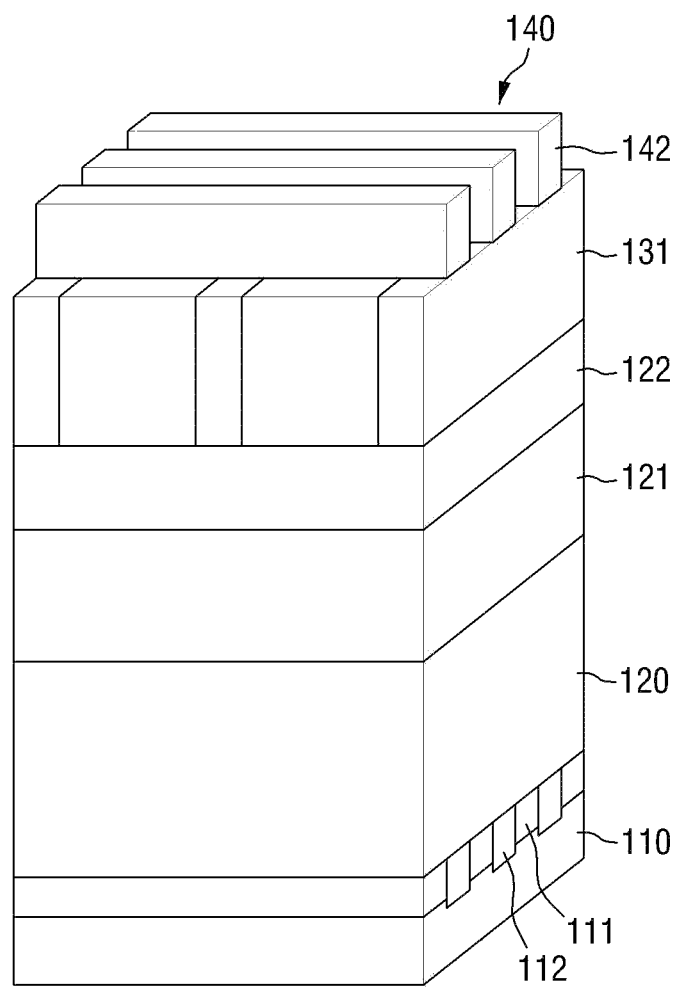

First, referring to FIGS. 25 to 27, a plurality of mask layers are formed on the insulating layer 120. In the illustrated example of this embodiment, two mask layers, namely, a first mask layer 121 and a second mask layer 122 are formed, but more than two mask layers may be formed to facilitate pattern formation.

Specifically, the first mask layer 121 and the second mask layer 122 are sequentially formed on the insulating layer 120 by CVD, PVD, ALD or the like. The first and second mask layers 121 and 122 may be formed to any appropriate thickness. The first mask layer 121 and the second mask layer 122 are also preferably formed of materials having different etching rates, i.e., a high etch selectivity. For example, the first mask layer 121 may be a layer of polysilicon, and the second mask layer 122 formed on the first mask layer 121 may be a silicon oxide layer.

Then, the first sacrificial layer pattern 130 including a plurality of the first lines 131 extending in the first direction and the inter-pattern insulating layer 132 are formed on the second mask layer 122. The second sacrificial layer pattern 140 including a plurality of the second lines 142 extending in the second direction is formed on the first sacrificial layer pattern 130 and the inter-pattern insulating layer 132.

Figure 28:
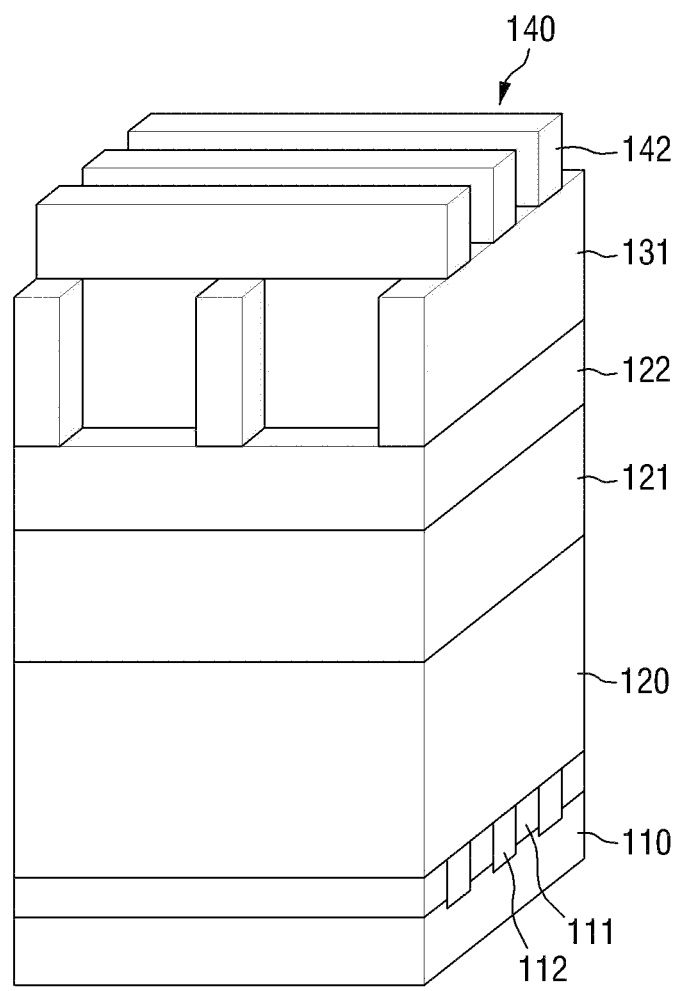
Figure 29:
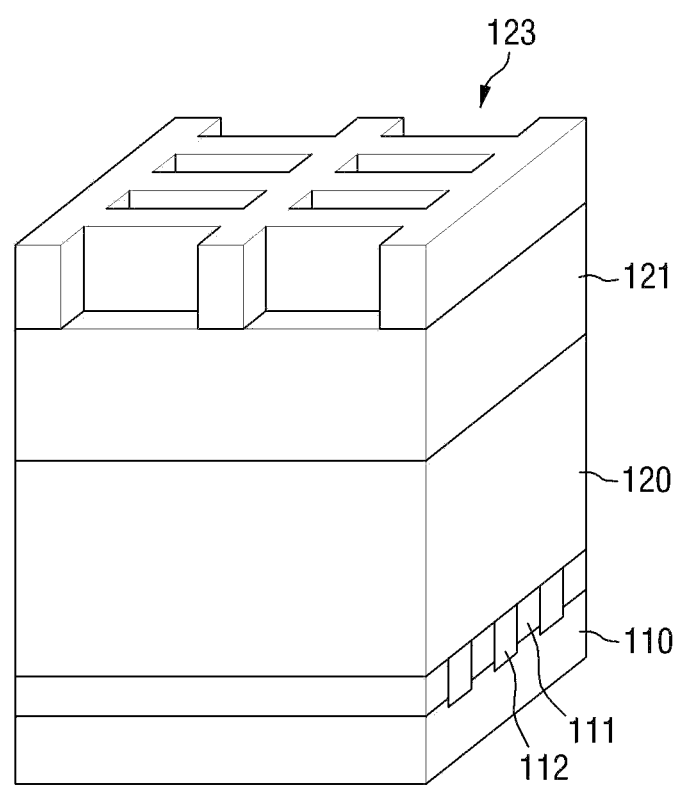

Referring to FIGS. 28 and 29, the inter-pattern insulating layer 132 is etched using the second sacrificial layer pattern 140 as a mask, and the second mask layer 122 is etched using the first sacrificial layer pattern 130 and the second sacrificial layer pattern 140 as a mask, thereby forming a pattern of openings 123.

Specifically, the inter-pattern insulating layer 132 is etched using the second sacrificial layer pattern 140 as an etch mask to expose the second mask layer 122 located below the inter-pattern insulating layer 132. The second mask layer 122 is etched using the first sacrificial layer pattern 130 and the second sacrificial layer pattern 140 as an etch mask. Accordingly, only portions of the second mask layer 122, which are covered with the first lines 131 of the first sacrificial layer pattern 130 and the second lines 142 of the second sacrificial layer pattern 140, remain.

Figure 30:
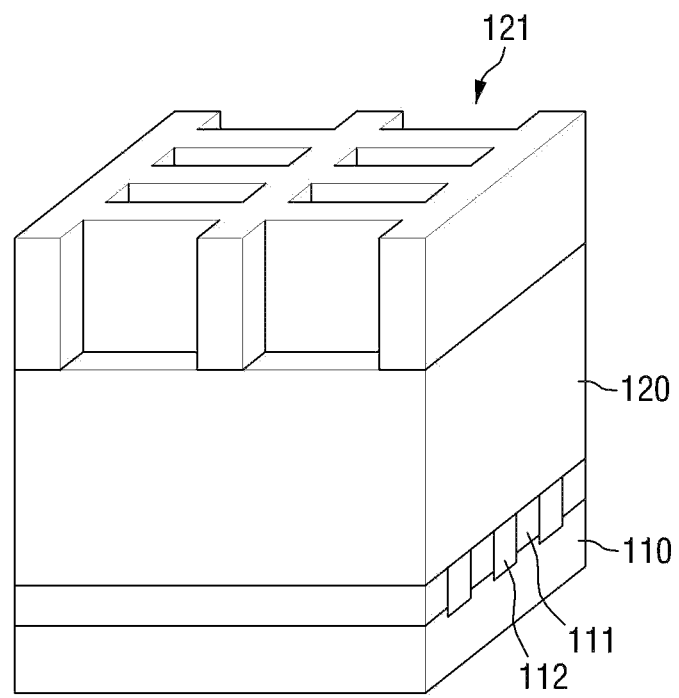
Figure 31:
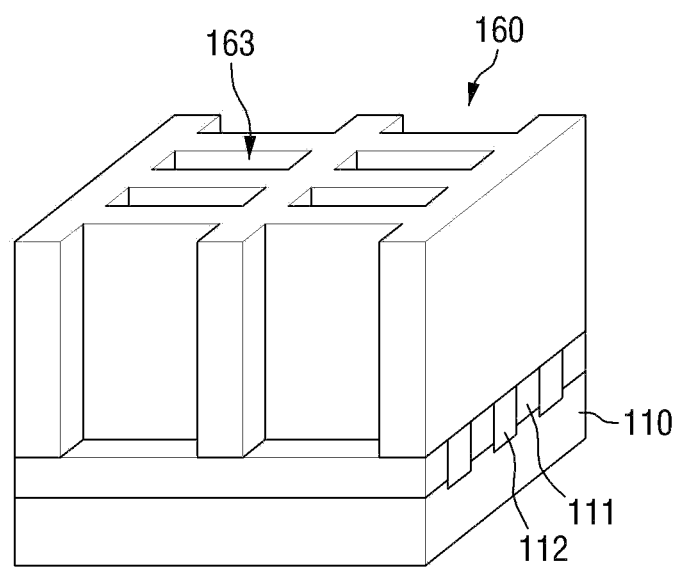

Referring to FIGS. 30 and 31, the first mask layer 121 and the insulating layer 120 are sequentially etched through the openings 123, thereby forming the insulating layer pattern 160 having a plurality of contact holes 163.

In all other respects, including the remaining steps, the method is similar to that of the first embodiment described above.

Figure 32:
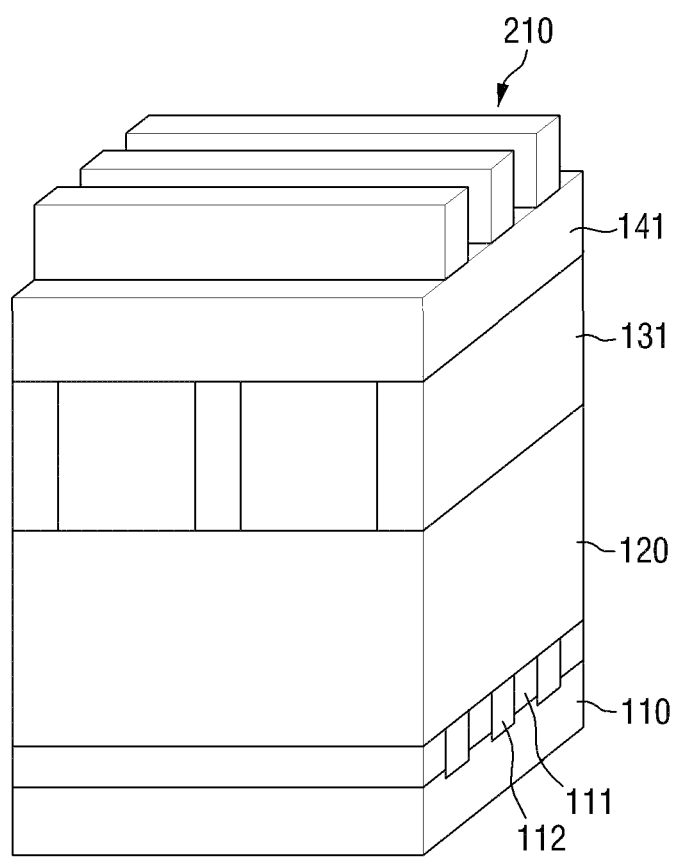
FIG. 32 is a perspective view of an intermediate structure during a stage in another embodiment of a method of manufacturing a phase change memory device in accordance with the inventive concept.

Hereinafter, still another embodiment of a method of manufacturing a phase change memory device in accordance with the inventive will be described with reference to FIGS. 6 and 32.

In this embodiment, the second sacrificial layer 141 is formed on the first sacrificial layer pattern 130 and the inter-pattern insulating layer 132. A mask pattern 210, which defines a region where the second sacrificial layer pattern will be formed, is formed on the second sacrificial layer 141. Then, the second sacrificial layer 141 is etched using the mask pattern 210 as an etch mask to form the second sacrificial layer pattern 140 including a plurality of the second lines 142 extending in the second direction.

In all other respects, including the remaining steps, the method may be similar to that of the first embodiment described above.

Hereinafter, still another embodiment of a method of manufacturing a phase change memory device in accordance with the inventive concept will be described with reference to FIGS. 19, 33 and 34.

Figure 33:
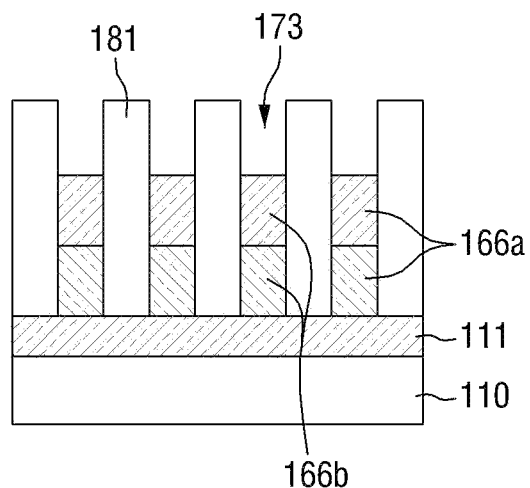
FIGS. 33 and 34 are cross-sectional views of intermediate structures during stages in another embodiment of a method of manufacturing a phase change memory device in accordance with the inventive concept.

Referring first to FIGS. 19 and 33, after forming an isolation layer 181, the isolation spacers 172 are removed, thereby forming second contact holes 173 to expose the semiconductor patterns 166a and 166b.

Figure 34:
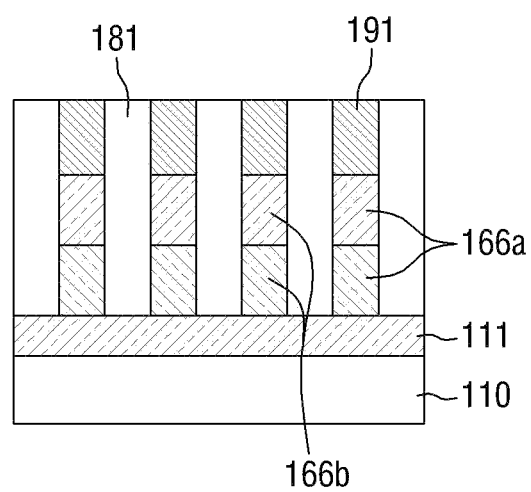

Referring to FIG. 34, a conductive layer (not shown) is deposited on the upper surface of the isolation layer 181 and in the second contact holes 173. Then, the conductive layer is planarized by etch-back, chemical mechanical polishing or the like until the upper surface of the isolation layer 181 is exposed, thereby forming the bottom electrode contacts 191.

In all other respects, including the remaining steps, the method may be similar to that of the first embodiment described above.

Figure 35:
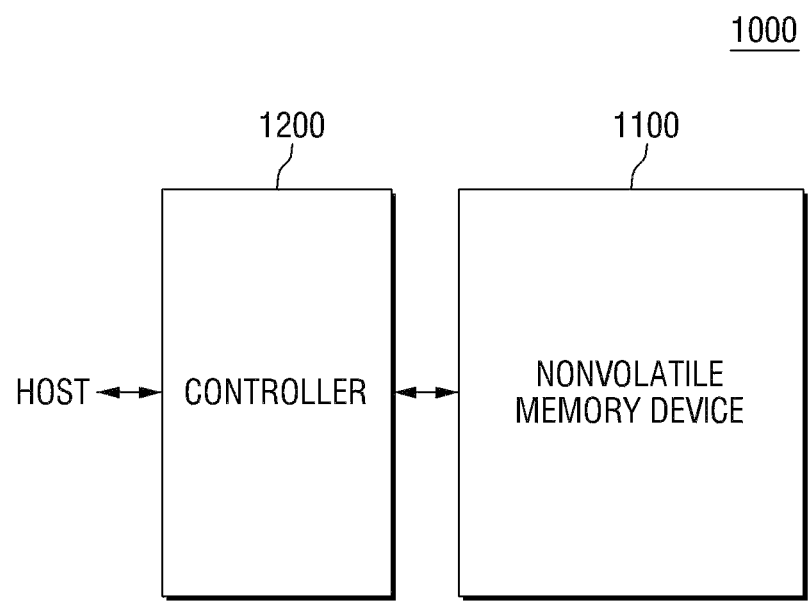
FIG. 35 is a block diagram of a memory system in accordance with the inventive concept.

A memory system in accordance with the inventive concept is shown in FIG. 35.

The memory system 1000 includes a non-volatile memory device 1100 and a controller 1200.

The non-volatile memory device 1100 may be configured and produced in any of the manners described above with reference to FIGS. 1 to 34.

The controller 1200 is connected to a host and the non-volatile memory device 1100. In response to the request of the host, the controller 1200 is configured to access the non-volatile memory device 1100. For example, the controller 1200 is configured to control the read, write, erase and background operations of the non-volatile memory device 1100. The controller 1200 also provides an interface between the non-volatile memory device 1100 and the host. The controller 1200 is configured to operate firmware for controlling the non-volatile memory device 1100.

The controller 1200 may include well-known components such as a random access memory (RAM), a processing unit, a host interface, and a memory interface. The RAM is used as at least one of an operation memory of the processing unit, a cache memory between the non-volatile memory device 1100 and the host, and a buffer memory between the non-volatile memory device 1100 and the host. The processing unit controls all operations of the controller 1200.

The host interface includes a protocol for performing data exchange between the host and the controller 1200. For example, the controller 1200 is configured to communicate with the outside (host) through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface interfaces with the non-volatile memory device 1100. For example, the memory interface includes a NAND interface or NOR interface.

The memory system 1000 may additionally include an error correction block. The error correction block is configured to detect and correct an error of data read from the non-volatile memory device 1100 using an error correction code (ECC). The error correction block may be a component of the controller 1200 or a component of the non-volatile memory device 1100.

Furthermore, the controller 1200 and the non-volatile memory device 1100 may be integrated as one semiconductor device. For example, the controller 1200 and the non-volatile memory device 1100 may be integrated in a memory card such as a PC card (personal computer memory card international association (PCMCIA)), a compact flash card (CF), a smart media card (SM, SMC), a multimedia card (MMC, RS-MMC, MMCmicro), or an SD card (SD, miniSD, microSD, SDHC), or in a memory stick or a universal flash storage device (UFS).

Alternatively, the controller 1200 and the non-volatile memory device 1100 may be integrated in a semiconductor drive (solid state drive (SSD)). A semiconductor drive (SSD) is a data storage device that includes a semiconductor memory configured to store the data. Such a semiconductor drive (SSD) is characterized as being capable of operating at high speeds with a host.

As additional examples, the memory system 1000 is provided as a component of an electronic device such as a computer (e.g., laptop, ultra mobile PC (UMPC) or web tablet, workstation, net-book, etc.), personal digital assistant (PDA), wireless phone (such as a smart phone or other type of mobile phone), an e-reader, a portable multimedia player (PMP), portable game console, navigation device, black boxe, digital camera, 3-dimensional television, digital audio recorder, digital audio player, digital picture recorder, digital picture player, digital video recorder, digital video player.

Basically, the inventive concept has applications in various types of electronic devices such as those capable of transmitting and receiving information in a wireless environment, constituting a home network, constituting a computer system or network, constituting a telematics network, or RFID devices.

Furthermore, the non-volatile memory device 1100 or the memory system 1000 may be packaged in various ways. For example, the non-volatile memory device 1100 or the memory system 1000 may constitute a package such as a package on package (PoP), a ball grid array (BGA) package, a chip scale package (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC) package, shrink small outline package (SSOP), thin small outline package (TSOP), thin quad flat pack (TQFP), system in package (SIP), multi chip package (MCP), wafer-level fabricated package (WFP), or wafer-level processed stack package (WSP).

Figure 36:
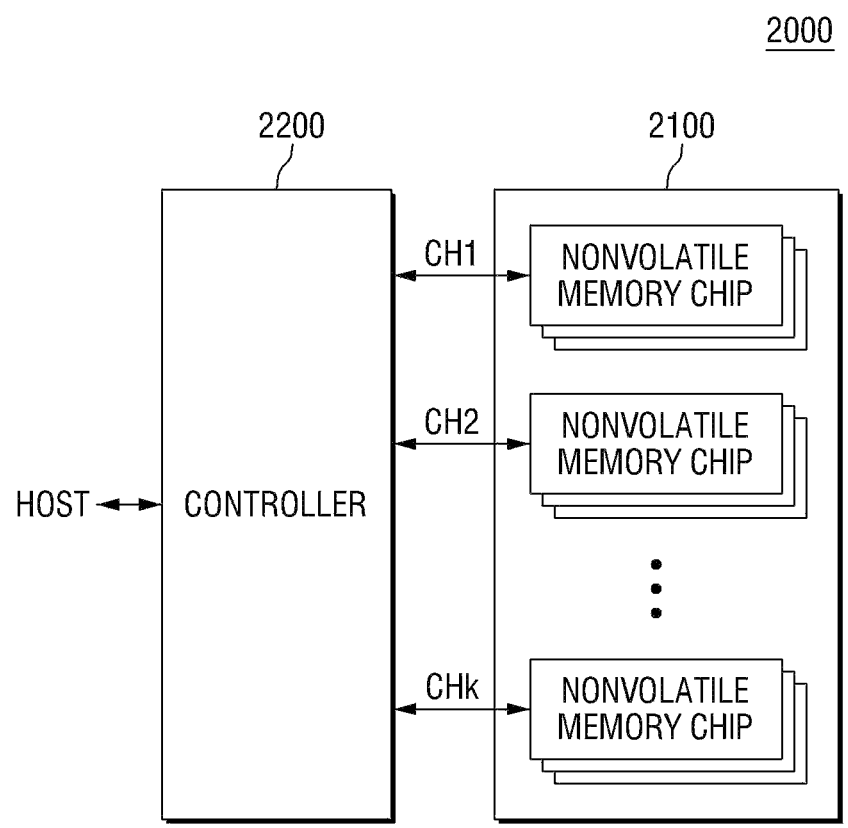
FIG. 36 is a block diagram of an application of the memory system of FIG. 35.

FIG. 36 shows an application example of the memory system of FIG. 35.

Referring to FIG. 36, a memory system 2000 includes a non-volatile memory device 2100 and a controller 2200. The non-volatile memory device 2100 includes a plurality of non-volatile memory chips. The non-volatile memory chips may divided into a plurality of groups. In this case, the non-volatile memory chips of each group communicate with the controller 2200 via one common channel. For example, the non-volatile memory chips communicate with the controller 2200 via first to k-th channels CH1 to CHk. Alternatively, the memory system 2000 may be configured such that the non-volatile chips are not divided into groups but instead each non-volatile memory chip communicate with the controller 2200 via its own dedicated channel.

In any case, each of the non-volatile memory chips may be a phase change memory device configured and produced in any of the ways described above with reference to FIGS. 1 to 34.

Figure 37:
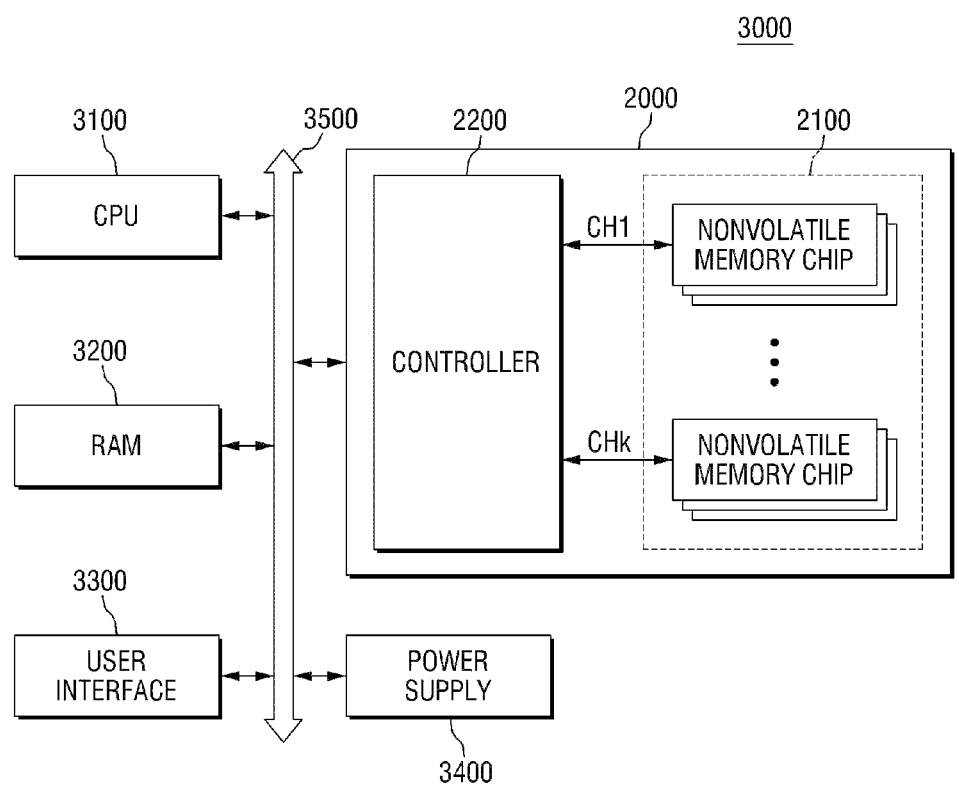
FIG. 37 is a block diagram of a computing system including the memory system of FIG. 36.

FIG. 37 shows a computing system including a memory system of the type described with reference to FIG. 36.

Referring to FIG. 37, a computing system 3000 includes a central processing unit 3100, a random access memory (RAM) 3200, a user interface 3300, a power supply 3400, and the memory system 2000.

The memory system 2000 is electrically connected to the central processing unit 3100, the RAM 3200, the user interface 3300 and the power supply 3400 via a system bus 3500. The data provided through the user interface 3300 or processed by the central processing unit 3100 is stored in the memory system 2000.

FIG. 37 illustrates a case in which the non-volatile memory device 2100 is connected to the system bus 3500 through the controller 2200. However, the non-volatile memory device 2100 may be configured to be directly connected to the system bus 3500.

Furthermore, although the computing system 3000 illustrated in FIG. 37 has only a memory system 2000 of the type described with reference to FIG. 36, the computing system 3000 may have the memory system 1000 described with reference to FIG. 16 instead of or in addition to memory system 2000.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of forming a contact, comprising:
    forming an insulating layer pattern including a plurality of contact holes on a substrate, the insulating layer pattern having first and second sidewalls delimiting the contact holes, the first sidewalls extending in a first direction and the second sidewalls extending in a second direction perpendicular to the first direction;
    forming initial semiconductor patterns in the contact holes, respectively;
    forming, on the initial semiconductor patterns and side surfaces of the first sidewalls, isolation spacers that expose portions of each of the initial semiconductor patterns; and
    etching the exposed portions of the initial semiconductor patterns using the isolation spacers as a first etching mask to divide each the initial semiconductor patterns into a plurality of semiconductor patterns.

2. The method of claim 1, wherein the first sidewalls are spaced from one other by distances which are larger than those by which the second sidewalls are spaced from one other.

3. The method of claim 1, wherein said forming of the insulating layer pattern comprises:
    forming an insulating layer on the substrate;
    forming a first sacrificial layer pattern on the insulating layer to expose portions of the insulating layer, and forming an inter-pattern insulating layer on the insulating layer to cover the exposed portions of the insulating layer;
    forming a second sacrificial layer pattern on the first sacrificial layer pattern and the inter-pattern insulating layer;
    etching the inter-pattern insulating layer using the second sacrificial layer pattern as a second etching mask; and
    etching the insulating layer using the first sacrificial layer pattern and the second sacrificial layer pattern as a third etching mask.

4. The method of claim 3, wherein said forming of the second sacrificial layer pattern comprises:
    forming a second sacrificial layer on the first sacrificial layer pattern and the inter-pattern insulating layer;
    forming a third sacrificial layer pattern of third lines extending in the second direction on the second sacrificial layer;
    forming sacrificial layer spacers at both sides of each of the third lines;
    removing the third sacrificial layer pattern after the sacrificial layer spacers have been formed at both sides of each of the third lines; and
    etching the second sacrificial layer using the sacrificial layer spacers as a fourth etching mask.

5. The method of claim 1, wherein said forming of the initial semiconductor patterns comprises:
    forming an epitaxial layer to such a thickness as to fill the contact holes; and
    removing portions of the epitaxial layer from upper portions of the contact holes.

6. The method of claim 1, wherein the initial semiconductor patterns are formed to occupy only lower portions of the contact holes such that upper portions of the first and second sidewalls of the insulating layer pattern project above upper surfaces of the initial semiconductor patterns,
    the upper portions of the second sidewalls of the insulating layer pattern are removed, and
    the isolation spacers are formed on the initial semiconductor patterns and the side surfaces of the first sidewalls after the upper portions of the second sidewalls have been removed.

7. The method of claim 6, wherein said forming of the isolation spacers comprises:
    forming an insulating layer on the initial semiconductor patterns and upper and side surfaces of the first sidewalls; and
    planarizing the insulating layer until the upper surfaces of the first sidewalls and the upper surface of the semiconductor pattern are exposed.

8. The method of claim 1, wherein said dividing the initial semiconductor patterns into a plurality of semiconductor patterns forms openings passing through the initial semiconductor patterns; and further comprising filling the openings with insulating material to form an isolation layer.

9. A method of manufacturing a phase change memory device, comprising:

forming, on a substrate, an insulating layer pattern including a plurality of first contact holes exposing portions of the substrate, the insulating layer pattern having first and second sidewalls delimiting the first contact holes, the first sidewalls extending in a first direction and the second sidewalls extending in a second direction perpendicular to the first direction;

forming vertical cell diodes in lower portions of the first contact holes, respectively, such that upper portions of the second sidewalls project above upper surfaces of the vertical cell diodes;

removing the upper portions of the second sidewalls which project above the upper surfaces of the vertical cell diodes;

forming, on the upper surfaces of the vertical cell diodes and side surfaces of the first sidewalls, isolation spacers that expose central portions of the upper surfaces of the vertical cell diodes; and etching the vertical cell diodes using the isolation spacers as a first etching mask to divide each of the vertical cell diodes into two vertical cell diodes.

10. The method of claim 9, wherein the pitch of the first contact holes in the second direction is at least two times the pitch of the first contact holes in the first direction.

11. The method of claim 9, wherein said forming of the insulating layer pattern comprises:

forming an insulating layer on the substrate;

forming a first sacrificial layer pattern including a plurality of first lines extending in the first direction on the insulating layer;

forming an inter-pattern insulating layer between the first lines;

forming a second sacrificial layer pattern including a plurality of second lines extending in the second direction on the first sacrificial layer pattern and the inter-pattern insulating layer;

etching the inter-pattern insulating layer using the second sacrificial layer pattern as a second etching mask to expose portions of the insulating layer; and etching the exposed portions of the insulating layer.

12. The method of claim 11, wherein said forming of the insulating layer pattern comprises:

sequentially forming first and second mask layers on the insulating layer such that the second mask layer is stacked on the first mask layer;

forming the first sacrificial layer pattern and the inter-pattern insulating layer on the second mask layer;

etching the inter-pattern insulating layer using the second sacrificial layer pattern as a third etching mask to expose portions of the second mask layer;

etching the second mask layer using the first sacrificial layer pattern and the second sacrificial layer pattern as a fourth etching mask to form a pattern of openings in the second mask layer; and sequentially etching the first mask layer and the insulating layer using the second mask layer having the pattern of openings.

13. The method of claim 9, further comprising:

forming an isolation layer by filling spaces between each pair of the two vertical cell diodes with insulating material;

forming bottom electrode contacts on the vertical cell diodes; and forming phase change material on the bottom electrode contacts.

14. The method of claim 13, wherein said forming of the bottom electrode contacts comprises:

planarizing the isolation layer to expose the vertical cell diodes;

forming a lower insulating layer on the vertical cell diodes, the isolation layer and upper surfaces of the first sidewalls, the lower insulating layer having second contact holes that expose portions of the vertical cell diodes; and filling the second contact holes with conductive material.

15. The method of claim 14, wherein said forming of the bottom electrode contacts comprises:

after the isolation layer is formed, removing the isolation spacers to form the second contact holes that expose the vertical cell diodes; and filling the second contact holes with conductive material.

16. A method of manufacturing a semiconductor device, comprising:

forming an insulating layer on a substrate, using photolithographic and etching processes to form quadrangular contact holes through the insulating layer and thereby form an insulating layer pattern;

forming initial patterns of semiconductor material in lower portions of the contact holes, respectively, wherein surfaces that delimit upper portions of the contact holes are left exposed;

forming an isolation layer pattern on the insulating layer pattern and initial patterns of semiconductor material; and using the isolation layer pattern as a first etching mask to divide each the initial patterns of semiconductor material into a plurality of semiconductor patterns.

17. The method of claim 16, wherein said forming of the contact holes through the insulating layer comprises:

forming a first line and space pattern of a first sacrificial material on the insulating layer, wherein the first line and space pattern includes a plurality of lines and spaces;

forming an inter-pattern insulating layer that fills the spaces of the first line and space pattern;

forming a second line and space pattern of a second sacrificial material on the first line and space pattern and the inter-pattern insulating layer, wherein the second line includes a plurality of lines and spaces which cross the lines and spaces of the first line and space pattern;

etching the inter-pattern insulating layer using the second line and space pattern as a second etching mask; and subsequently etching the insulating layer.

18. The method of claim 16, wherein the forming of the isolation layer pattern comprises conformally forming an insulating layer on the insulating layer pattern and initial patterns of semiconductor material, and said using the isolation layer pattern to divide each the initial semiconductor patterns into a plurality of semiconductor patterns comprises:

etching an isolation layer to form isolation layer pattern that exposes parts of the upper surfaces of each of the initial patterns of semiconductor material.

19. The method of claim 16, wherein the forming of the initial patterns of semiconductor material comprises forming a first layer of semiconductor material of a first conductivity type and forming a second layer of a semiconductor material of a second conductivity type on the first layer of semiconductor material, and the plurality of semiconductor patterns are pairs of vertical diodes, respectively.

20. The method of claim 19, further comprising:

forming an isolation layer by filling an insulating material in spaces located between two adjacent vertical cell diodes;

forming bottom electrode contacts on the vertical cell diodes; and forming variable resistance material on the bottom electrode contacts.

\* \* \* \* \*